(12) United States Patent
Park (10) Patent No.: US 8,363,498 B2
(45) Date of Patent: Jan. 29, 2013

(54) NON-VOLATILE MEMORY DEVICE

(75) Inventor: Kyoung Wook Park, Cheongwon-gun (KR)

(73) Assignee: Hynix Semiconductor Inc., Icheon (KR)

( * ) Notice: Subject to any disclaimer, the term of this patent is extended or adjusted under 35 U.S.C. 154(b) by 215 days.

(21) Appl. No.: 12/823,997

(22) Filed: Jun. 25, 2010

(65) Prior Publication Data

US 2011/0292749 A1 Dec. 1, 2011

(30) Foreign Application Priority Data

May 27, 2010 (KR) .................. 10-2010-0049654

(51) Int. Cl.
*G11C 7/00* (2006.01)

(52) U.S. Cl. ......... 365/203; 365/163; 365/148; 365/226

(58) Field of Classification Search .................. 365/203, 365/163, 226, 148, 210.1, 229
See application file for complete search history.

(56) References Cited

U.S. PATENT DOCUMENTS

| | | | | |
|---|---|---|---|---|
| 7,898,872 B2* | 3/2011 | Han | ........................ | 365/185.25 |
| 7,944,739 B2* | 5/2011 | Kang et al. | ................... | 365/163 |
| 2010/0128517 A1* | 5/2010 | Bedeschi et al. | .............. | 365/163 |

FOREIGN PATENT DOCUMENTS

| | | |
|---|---|---|
| KR | 1019990075686 A | 10/1999 |
| KR | 100262003 B1 | 4/2000 |

* cited by examiner

*Primary Examiner* — VanThu Nguyen
*Assistant Examiner* — Hai Pham (57) ABSTRACT

A non-volatile memory device includes a plurality of mats, each of which includes a unit cell in an intersection area between each of a plurality of word lines and each of a plurality of bit lines such that a read or write operation of data is achieved in each mat, a column switching unit configured to select any one of bit lines from among the plurality of bit lines according to a column selection signal, and selectively control a connection between the selected bit line and a global bit line, and a discharge unit, in an active mode in which the read or write operation is achieved, configured to discharge the remaining bit lines other than the selected bit line from among the plurality of bit lines in response to a bit line discharge signal.

18 Claims, 9 Drawing Sheets

NON-VOLATILE MEMORY DEVICE

CROSS-REFERENCE TO RELATED APPLICATION

The priority of Korean patent application No. 10-2010-0049654 filed on May 27, 2010, the disclosure of which is hereby incorporated in its entirety by reference, is claimed.

BACKGROUND OF THE INVENTION

Embodiments of the present invention relate to a non-volatile memory device, and more specifically, to a technology for increasing the operation reliability of the device.

Memory devices may be classified into a volatile memory device and a non-volatile memory device. The non-volatile memory device includes a non-volatile memory cell capable of preserving stored data even when not powered. For example, the non-volatile memory device may be implemented as a flash random access memory (flash RAM), a phase change random access memory (PCRAM), or the like.

The PCRAM includes a memory cell that is implemented using a phase change material such as germanium antimony tellurium (GST), wherein the GST changes to a crystalline phase or an amorphous phase if heat is applied to the GST, thereby storing data in the memory cell.

A non-volatile memory device (e.g., a magnetic memory, a phase change memory (PCM), or the like) has a data processing speed similar to that of a volatile RAM. The non-volatile memory device also preserves data even when power is turned off.

Figure 1A:
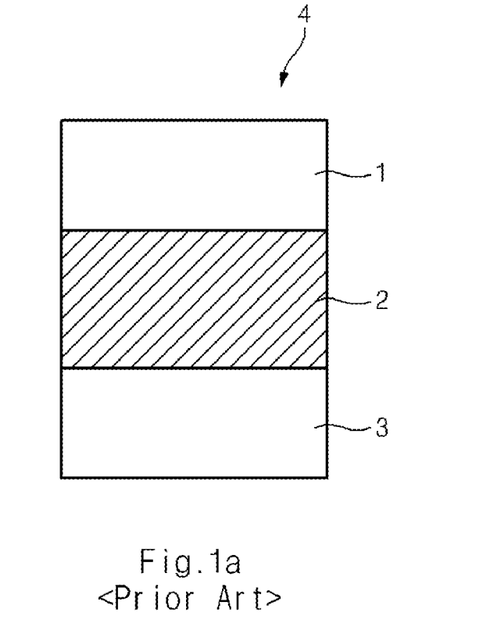
FIGS. 1A and 1B illustrate a conventional phase change resistor (PCR) element.
Figure 1B:
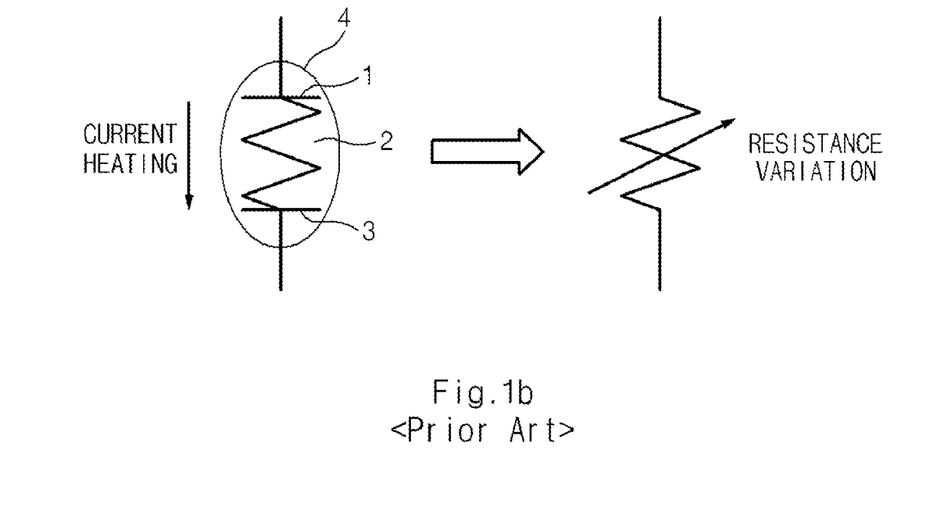

FIGS. 1A and 1B illustrate a conventional phase change resistor (PCR) element 4.

The PCR element 4 includes a top electrode 1, a bottom electrode 3, and a phase change material (PCM) layer 2 located between the top electrode 1 and the bottom electrode 3. If a voltage and a current are applied to the PCM layer 2, a high temperature is induced in the PCM layer 2, such that an electrical conductive state of the PCM layer 2 changes depending on resistance variation. In this case, the PCM layer 2 may be formed of AgInSbTe. The PCM layer 2 uses chalcogenide, the main components of which are chalcogen elements (e.g., S, Se and Te). In more detail, the PCM layer 2 may be formed of a germanium antimony tellurium alloy ($Ge_2Sb_2Te_5$) composed of Ge—Sb—Te.

Figure 2A:
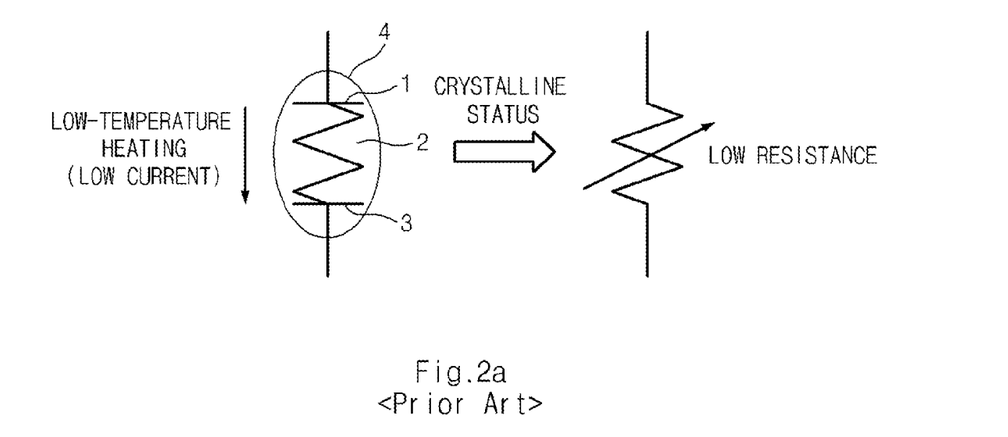
FIGS. 2A and 2B illustrate a phase change principle of the conventional PCR element.
Figure 2B:
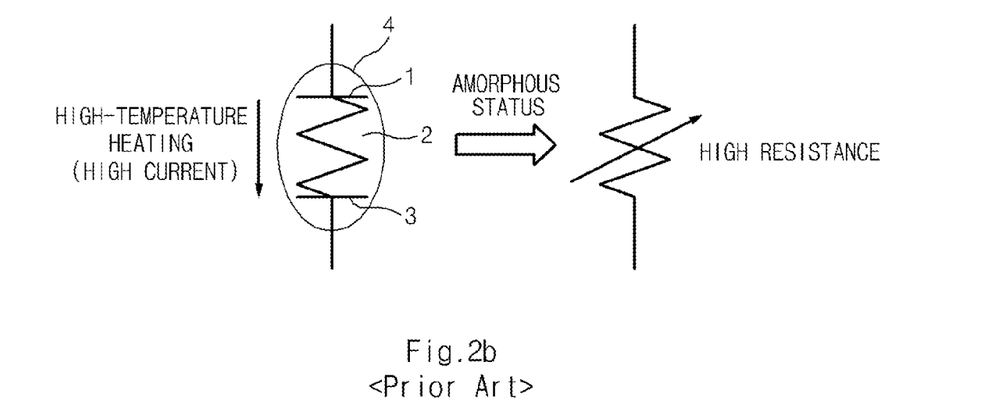

FIGS. 2A and 2B are views showing a phase change principle of the conventional PCR element 4.

Referring to FIG. 2A, if a low current smaller than a threshold value flows in the PCR element 4, the PCM layer 2 has a temperature suitable for a crystalline phase. Therefore, the PCM layer 2 changes to the crystalline phase, such that it is changed to a low-resistance phase material.

On the other hand, as shown in FIG. 2B, if a high current greater than the threshold value flows in the PCR element 4, the PCM layer 2 has a temperature higher than a melting point. Therefore, the PCM layer 2 changes to an amorphous phase, such that it is changed to a high-resistance phase material.

As described above, the PCR element 4 can store data corresponding to two resistance phases as non-volatile data. That is, assuming that one case in which the PCR element 4 is in a low-resistance state corresponds to data "1" and the other case in which the PCR element 4 is in a high-resistance state corresponds to data "0", the PCR element 4 may store two logic states of data.

Figure 3:
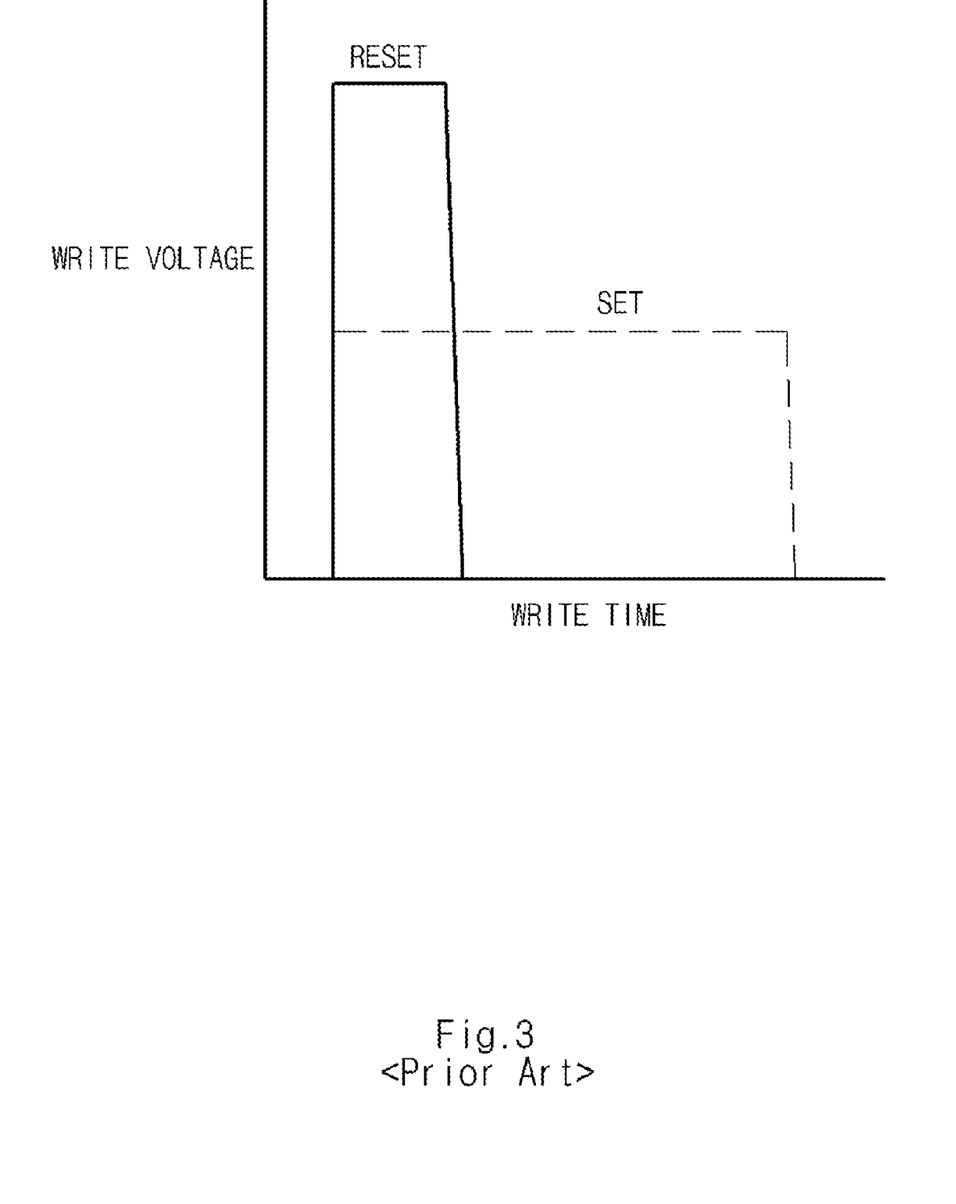
FIG. 3 illustrates a write operation of a conventional PCR cell.

FIG. 3 illustrates a write operation of a conventional PCR cell.

Referring to FIG. 3, when a current flows between the top electrode 1 and the bottom electrode 3 of the PCR element 4 for a predetermined time, a high temperature is generated. Therefore, the PCM layer 2 changes from a crystalline phase to an amorphous phase in response to the temperature change to the top electrode 1 and the bottom electrode 3.

In this case, when a low current flows in the PCR element 4 during the predetermined time, the PCM layer 2 has the crystalline phase formed by a low-temperature heating state and the PCR element 4 becomes a low-resistance element having a set state. On the other hand, when a high current flows in the PCR element 4 during the predetermined time, the PCM layer 2 has the amorphous phase formed by a high-temperature heating state and the PCR element 4 becomes a high-resistance element having a reset state. Thus, a difference between two phases is represented by a variation in electrical resistance.

Accordingly, in order to write the set state during the write operation, a low voltage is applied to the PCR element 4 for a long period of time. On the other hand, in order to write the reset state during the write operation, a high voltage is applied to the PCR element 4 for a short period of time.

Figure 4:
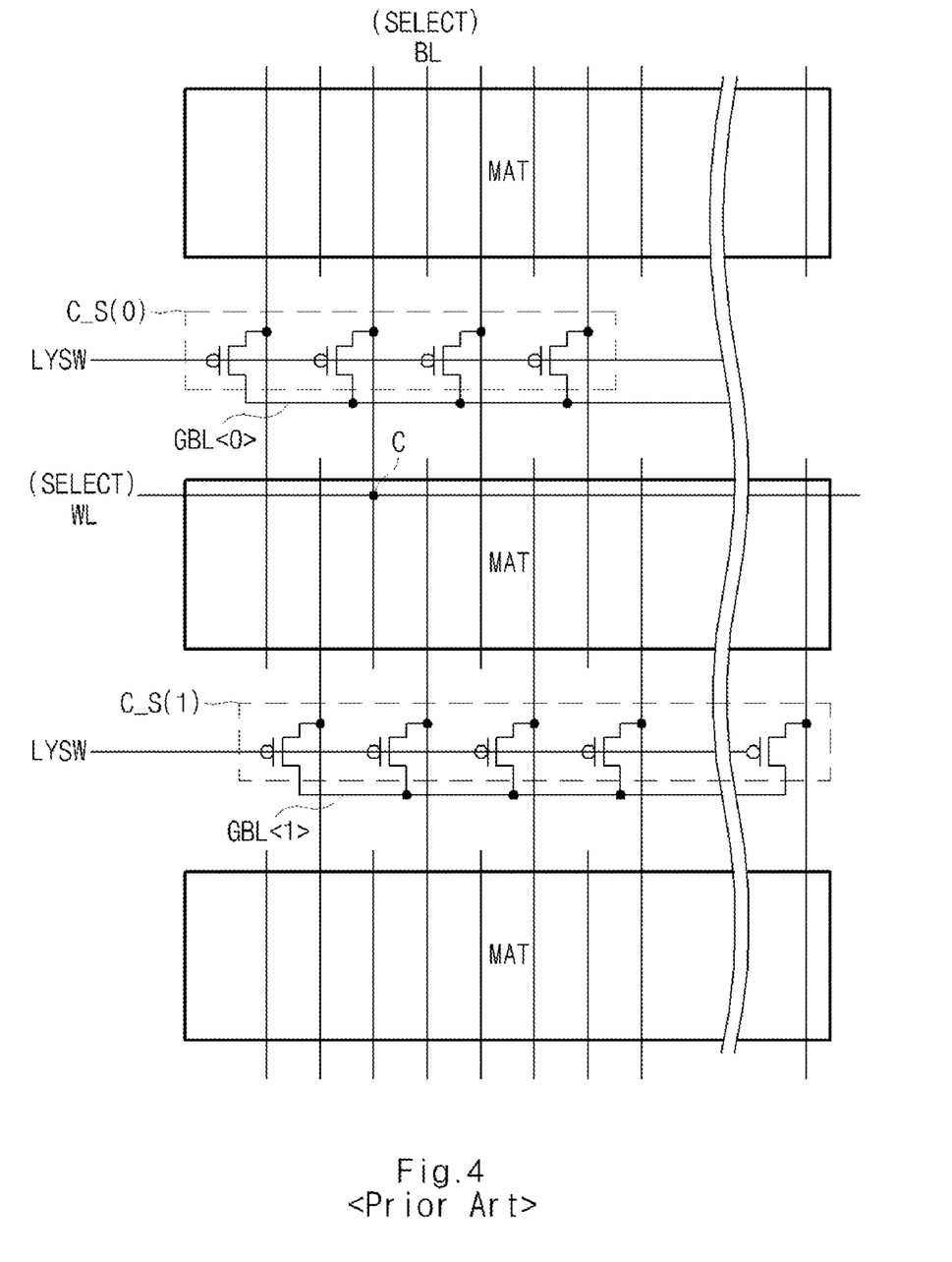
FIG. 4 is a circuit diagram illustrating a conventional phase change memory device.

FIG. 4 is a circuit diagram illustrating a conventional phase change memory device.

Referring to FIG. 4, the conventional phase change memory device includes column switching units C_S(0) and C_S(1) and a plurality of mats. Each mat includes unit cells, each of which is formed at an intersectional area between a bit line BL and a word line WL.

In this case, the column switching unit C_S(0) or C_S(1) is coupled between the bit line BL and a global bit line GBL, and it is controlled by a column selection signal LYSW. The column switching units C_S(0) and C_S(1) are selectively turned on according to the column selection signal LYSW, such that the coupling between the bit line BL and the global bit line GBL is controlled.

During an active mode, only one column selection signal (e.g., LYSW<0:7>) is activated, such that a unit cell C coupled to a corresponding bit line BL is selected.

Figure 5:
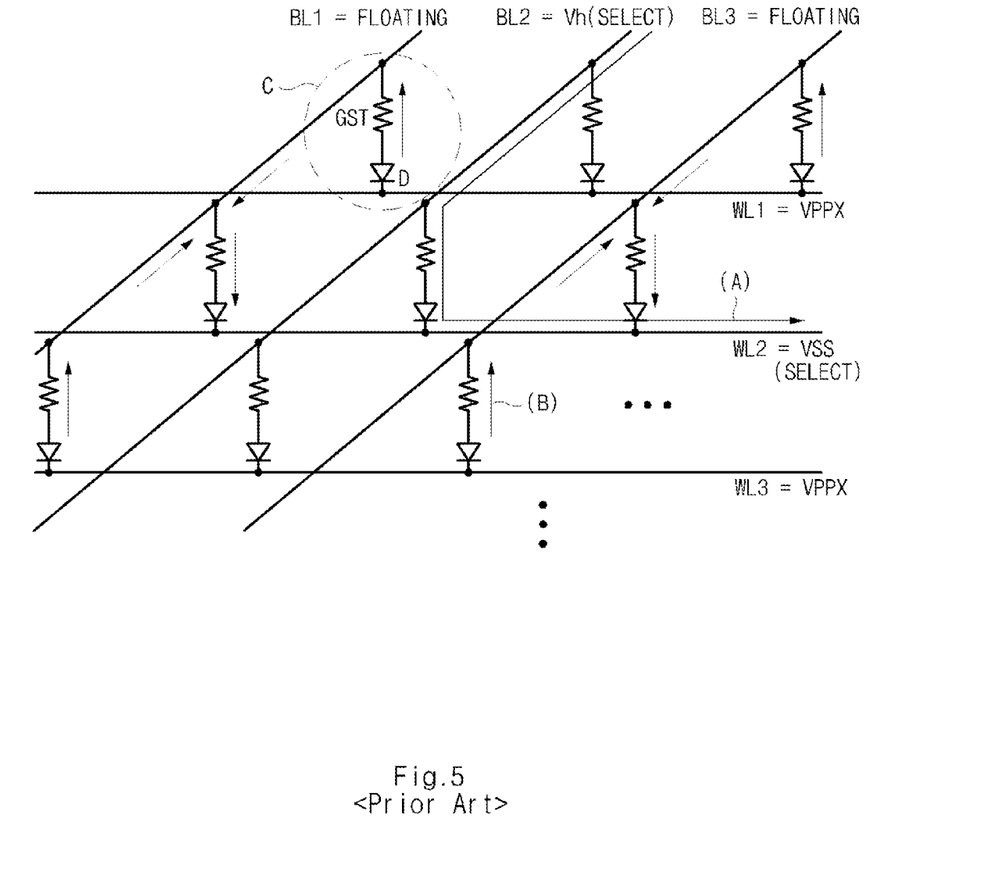
FIG. 5 illustrates a current path in a cell array of a mat shown in FIG. 4.

FIG. 5 illustrates a current path in a cell array of the mat shown in FIG. 4.

Referring to FIG. 5, the conventional cell array includes a unit cell C disposed in an intersectional area between the a bit line BL and a word line WL. The unit cell C includes a phase change resistor (PCR) element GST and a cell switch. In this case, the cell switch may be formed of a diode D, and the diode D may be formed of a PN diode.

One electrode of the PCR element GST is coupled to the bit line BL, and the other electrode thereof is coupled to a P-type region of the diode D. An N-type region of the diode D is coupled to the word line WL.

In the conventional cell array, a low voltage (e.g., a ground voltage VSS) is applied to a selected word line WL2 during a read operation. In addition, a read voltage Vh is applied to a selected bit line BL2, such that a set-state read current Iset or a reset-state read current Ireset flows to the selected word line WL2 through the bit line BL, the PCR element GST and the diode D. A current flow formed during the read operation is denoted by a path A.

A sense-amplifier senses cell data transmitted through the bit line BL2, and compares the sensed cell data with a reference voltage, such that it discriminates whether the sensed cell data corresponds to data "1" or data "0". When writing data in a cell, a write driver provides a driving voltage corresponding to write data to the bit line BL.

When the bit line BL2 is selected, each non-selected bit lines BL1 and BL3 enters a floating status. Meanwhile, when the word line WL2 is selected, each non-selected word lines WL1 and WL3 maintains a pumping voltage (VPPX) level.

However, assuming that the high pumping voltage (VPPX) is applied to each non-selected word line WL1 or WL3 in the conventional cell array, an OFF leakage current shown by a reference character B may be generated.

That is, while each non-selected word line WL1 or WL3 has the high pumping voltage VPPX level, the selected word line WL2 has a relatively low ground voltage (VSS) level. Therefore, a reverse leakage current flows in a diode of each non-selected cell, such that a voltage level of the selected word line WL2 is unnecessarily increased.

Generally, a resistive memory may include a cell switch. Each unit cell C includes this cell switch. Although the number of cell switches coupled to one bit line BL is changed according to a cell array structure, the number of cell switches is generally set to a very high value "K".

Assuming that a leakage current occurs in numerous cell switches, a current of about several hundred μA is provided to the bit line BL, such that a voltage level of the bit line BL is increased. Specifically, in case of a structure in which the bit line BL shares two mats, a leakage current generated from two mats flows in the word line WL2, which may induce more serious problems.

In this case, a threshold voltage of a PCR element GST and a cell switch is present between the selected word line WL2 and the non-selected bit line BL1 or BL3.

However, the voltage level of the bit line BL increased by the leakage current is much higher than a voltage level of the word line WL2. Therefore, if the voltage level of the bit line BL is increased, a leakage current (i.e., a leakage path) is generated toward the selected word line WL2. As a result, the voltage level of the selected word line WL2 is increased.

Figure 6:
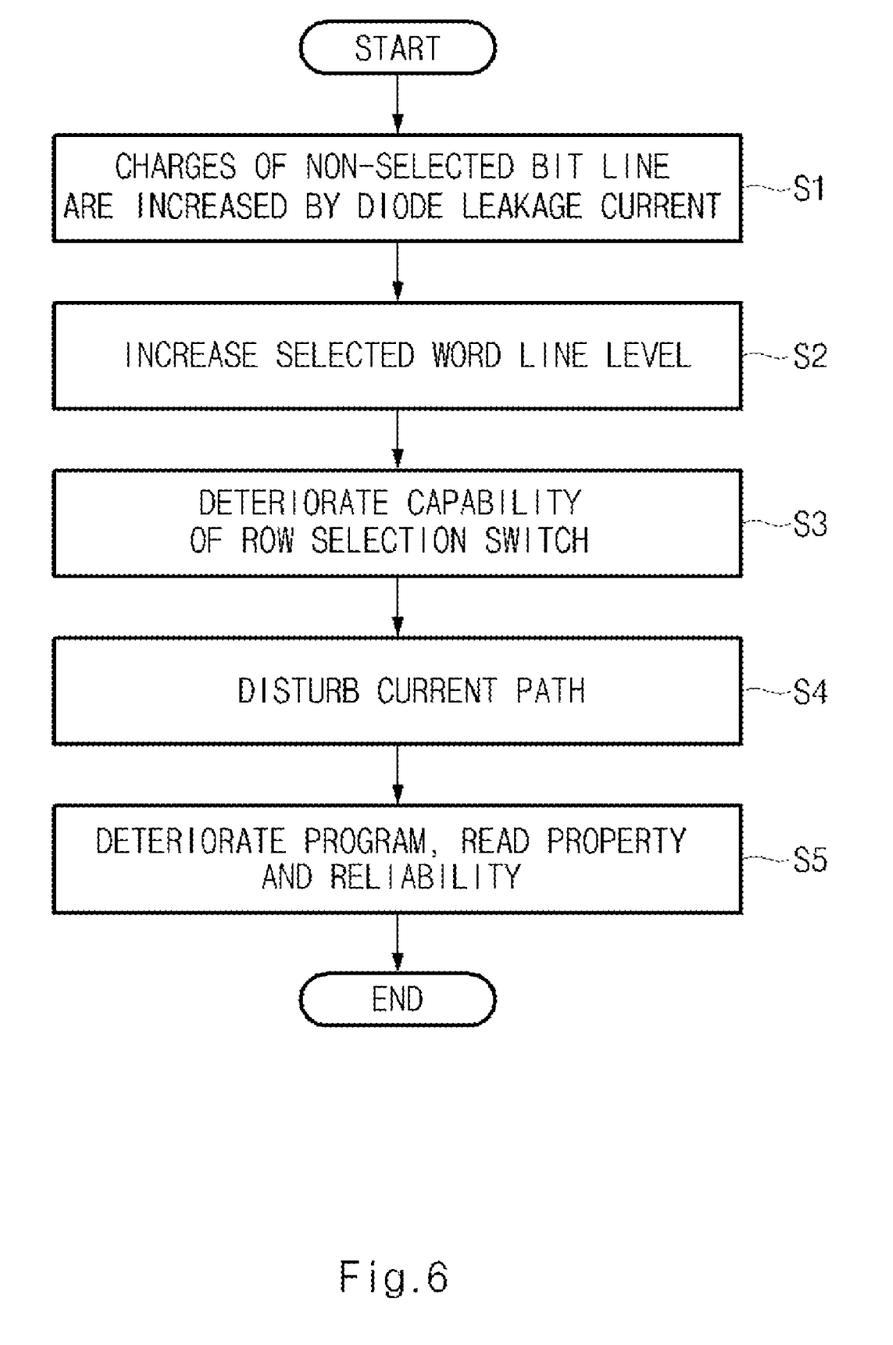
FIG. 6 is a flowchart illustrating problems encountered in a leakage path.

FIG. 6 is a flowchart illustrating the problems encountered in the leakage path.

Referring to FIG. 6, electric charges in the non-selected bit lines BL1 and BL3 are unnecessarily increased by a leakage current generated from diodes of non-selected cells in the conventional cell array at step S1.

That is, electric charges are input to the non-selected bit lines BL1 and BL3 by the switching leakage current of the diodes, and the input electric charges flow toward the selected word line WL2, which induces a faulty operation. Specifically, an unexpected current may flow through a non-selected bit line during an operation of the memory device having a relatively long sensing time, and the unexpected current may cause the faulty operation.

Thus, the voltage level of the selected word line WL2 is increased by the input electric charges at step S2. Accordingly, the capability of a row selection switch LXSW (not shown) for selecting a corresponding word line among a plurality of word lines may be deteriorated at step S3.

As a result, a path of current flowing to the selected word line WL2 is disturbed at step S4. That is, a faulty operation may be caused by the leakage current generated in the operation of the memory device, and thus program and read properties and the operation reliability of the memory device may be decreased at step S5.

BRIEF SUMMARY OF THE INVENTION

Embodiments of the present invention are directed to providing a non-volatile memory device that substantially obviates one or more problems due to limitations and disadvantages of the related art.

First, an embodiment of the present invention relates to a non-volatile memory device for discharging a non-selected bit line in a read or write operation of data so as to substantially prevent a leakage current from being applied to a word line and a bit line, thereby improving the operation reliability.

Second, an embodiment of the present invention relates to a non-volatile memory device for discharging a selected bit line in a manner of a pulse shape prior to an active operation and maintaining a turn-on state of a non-selected bit line in a manner of a level shape during read and/or write operation(s), thereby forming a discharge path of the bit lines.

Third, an embodiment of the present invention relates to a non-volatile memory device for substantially preventing voltage levels of a bit line and a word line from being increased by a reverse current generated in a diode of a phase change cell, thereby improving program and read characteristics.

Fourth, an embodiment of the present invention relates to a non-volatile memory device for coding a bit line discharge signal so as to selectively control a desired bit line to be discharged, thereby improving discharge characteristics.

In accordance with one embodiment of the present invention, the non-volatile memory device includes a cell array comprising a plurality of unit cells configured to be coupled to a plurality of word lines and a plurality of bit lines; a column switching unit configured to select one of the plurality of bit lines; and a discharge unit, configured to discharge bit lines other than the selected bit line among the plurality of bit lines in response to a bit line discharge signal in an active mode in which a read or write operation is performed.

In accordance with another embodiment of the present invention, the non-volatile memory device includes first and second mats, each mat including a plurality of unit cells configured to be coupled a plurality of word lines and a plurality of bit lines, wherein the plurality of bit lines is shared by the first and second mats; a column switching unit configured to select one of the plurality of bit lines; a first discharge unit, disposed near the first mat, configured to discharge bit lines other than the selected bit line among the plurality of bit lines according to a plurality of bit line discharge signals in an active mode in which a read or write operation is performed; and a second discharge unit disposed proximate the second mat, and configured to discharge the bit lines other than the selected bit line according to the plurality of bit line discharge signals in the active mode.

It is to be understood that both the foregoing general description and the following detailed description of the present invention are exemplary and explanatory and are intended to provide further explanation of the invention as claimed.

It will be appreciated by persons skilled in the art that that the effects that can be achieved with the present invention are not limited to what has been particularly described hereinabove and other advantages of the present invention will be more clearly understood from the following detailed description taken in conjunction with the accompanying drawings.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 7:
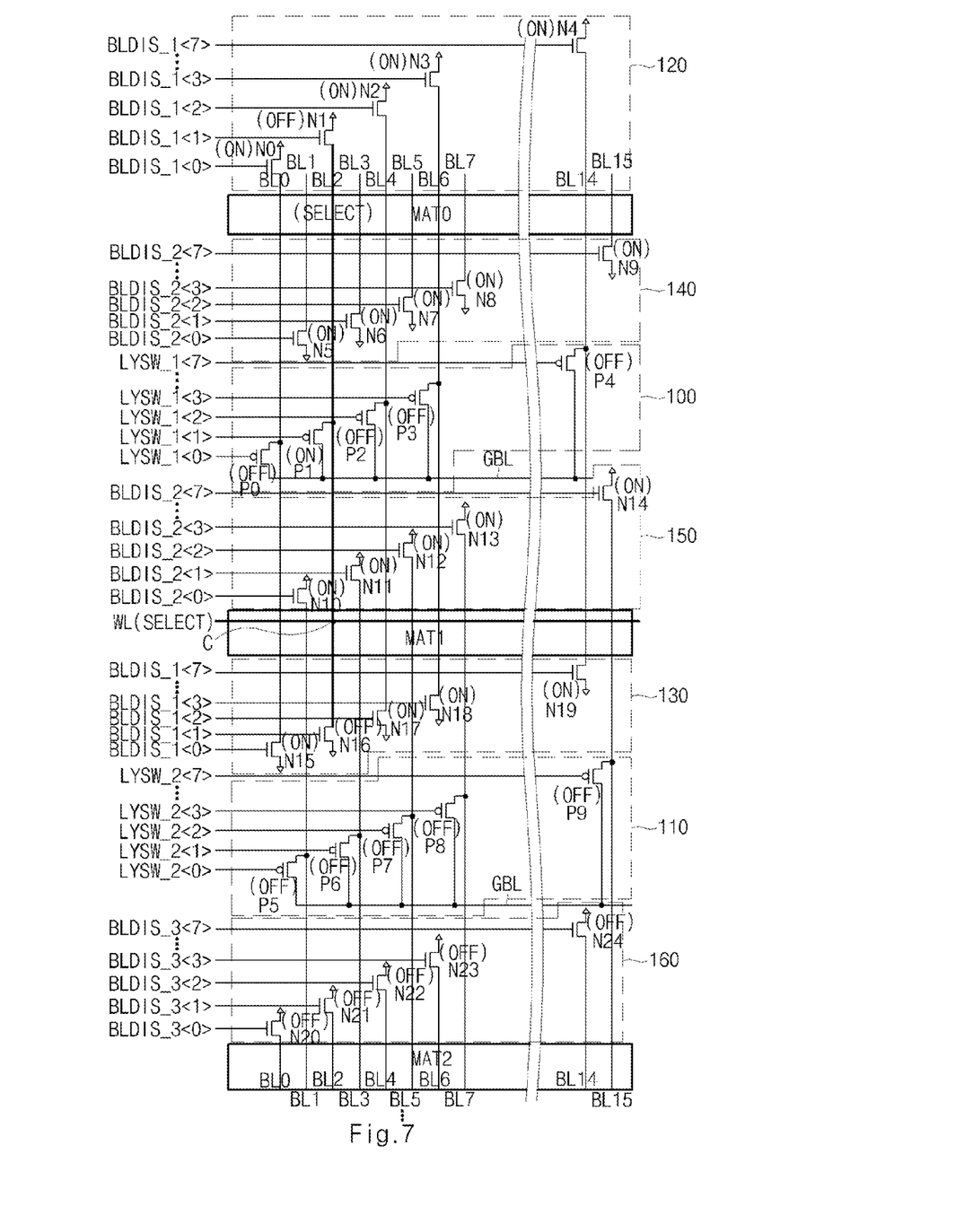
FIG. 7 is a circuit diagram illustrating a non-volatile memory device according to an embodiment of the present invention.

FIG. 7 is a circuit diagram illustrating a non-volatile memory device according to an embodiment of the present invention.

Referring to FIG. 7, the non-volatile memory device includes a plurality of mats, a plurality of column switching units 100 and 110, and a plurality of discharge units 120 to 160. Each mat includes a unit cell C formed at an intersectional area between a bit line BL and a word line WL.

For convenience of description and better understanding of the present invention, the following embodiment of the present invention provides an exemplary structure in which a bit line BL is shared by two adjacent mats. As illustrated in FIG. 7, even-numbered bit lines BL0, BL2, BL4, BL6, BL8, BL10, BL12 and BL14 are shared by two mats MAT0 and MAT1, and odd-numbered bit lines BL1, BL3, BL5, BL7, BL9, BL11, BL13 and BL15 are shared by two mats MAT1 and MAT2.

The column switching unit 100 includes a plurality of PMOS transistors P0~P4 which are coupled between a global bit line GBL and the even-numbered bit lines BL0, BL2, BL4, BL6, BL8, BL10, BL12 and BL14 and are controlled by column selection signals LYSW_1<0:7>. In this case, the number of PMOS transistors included in the column switching unit 100 is identical to the number of column selection signals LYSW_1<0:7>.

In the column switching unit 100, the PMOS transistors P0~P4 are selectively turned on according to the column selection signals LYSW_1<0:7>, thereby controlling the connection between the global bit line GBL and each even-numbered bit line BL0, BL2, BL4, BL6, BL8, BL10, BL12 or BL14. In addition, in an active mode, only one signal among the column selection signals LYSW_1<0:7> is activated, such that it selects a unit cell C coupled to a corresponding bit line BL.

The column switching unit 110 includes a plurality of PMOS transistors P5~P9, which are coupled between the global bit line GBL and the odd-numbered bit lines BL1, BL3, BL5, BL7, BL9, BL11, BL13 and BL15 and are controlled by column selection signals LYSW_2<0:7>. In this case, the number of PMOS transistors included the column switching unit 110 is identical to the number of column selection signals LYSW_2<0:7>.

In the column switching unit 110, the PMOS transistors P5~P9 are selectively turned on according to the column selection signals LYSW_2<0:7>, thereby controlling the connection between the global bit line GBL and each odd-numbered bit line BL1, BL3, BL5, BL7, BL9, BL11 or BL15. In addition, in the active mode, only one signal among the column selection signals LYSW_2<0:7> is activated, such that it selects a unit cell C coupled to a corresponding bit line BL.

Meanwhile, the discharge unit 120 includes a plurality of NMOS transistors N0~N4, which are coupled between a ground voltage input terminal and the even-numbered bit lines BL0, BL2, BL4, BL6, BL8, BL10, BL12 and BL14 and are controlled by bit line discharge signals BLDIS_1<0:7>. In this case, the number of NMOS transistors included in the discharge unit 120 is identical to the number of bit line discharge signals BLDIS_1<0:7>. In addition, the discharge unit 120 is disposed near the mat MAT0.

In the discharge unit 120, the NMOS transistors N0~N4 are selectively turned on according to the bit line discharge signals BLDIS_1<0:7>, such that a discharge path of each even-numbered bit line BL0, BL2, BL4, BL6, BL8, BL10, BL12 or BL14 is formed.

The discharge unit 130 includes a plurality of NMOS transistors N15~N19, which are coupled between the ground voltage input terminal and the even-numbered bit lines BL0, BL2, BL4, BL6, BL8, BL10, BL12 and BL14 and are controlled by the bit line discharge signals BLDIS_1<0:7>. In this case, the number of NMOS transistors N15~N19 is identical to the number of bit line discharge signals BLDIS_1<0:7>. The discharge unit 130 is disposed near the mat MAT1.

In the discharge unit 130, the NMOS transistors N15~N19 are selectively turned on according to the bit line discharge signals BLDIS_1<0:7>, such that a discharge path of each even-numbered bit line BL0, BL2, BL4, BL6, BL8, BL10, BL12 or BL14 is formed.

In this case, the discharge units 120 and 130 respectively form discharge paths of the upper mat MAT0 and the lower mat MAT1 which share the even-numbered bit lines BL0, BL2, BL4, BL6, BL8, BL10, BL12 and BL14.

That is, the discharge unit 120 performs a bit-line discharge operation at the upper mat MAT0, and the discharge unit 130 performs a bit-line discharge operation at the lower mat MAT1.

In the meantime, the discharge unit 140 includes a plurality of NMOS transistors N5~N9, which are coupled between the ground voltage input terminal and odd-numbered bit lines BL1, BL3, BL5, BL7, BL9, BL11, BL13 and BL15 of the mat MAT0 and are controlled by bit line discharge signals BLDIS_2<0:7>. In this case, the number of NMOS transistors N5~N9 is identical to the number of bit line discharge signals BLDIS_2<0:7>.

In the discharge unit 140, the NMOS transistors N5~N9 are selectively turned on according to the bit line discharge signals BLDIS_2<0:7>, such that a discharge path of each odd-numbered bit line BL1, BL3, BL5, BL7, BL9, BL11, BL13 or BL15 is formed.

The discharge unit 150 includes a plurality of NMOS transistors N10~N14, which are coupled between the ground voltage input terminal and the odd-numbered bit lines BL1, BL3, BL5, BL7, BL9, BL11, BL13 and BL15 shared by the mats MAT1 and MAT2 and are controlled by the bit line discharge signals BLDIS_2<0:7>. In this case, the number of NMOS transistors N10~N14 is identical to the number of bit line discharge signals BLDIS_2<0:7>.

In the discharge unit 150, the NMOS transistors N10~N14 are selectively turned on according to the bit line discharge signals BLDIS_2<0:7>, such that a discharge path of each odd-numbered bit line BL1, BL3, BL5, BL7, BL9, BL11, BL13 or BL15 is formed.

In this case, the discharge units 140 and 150 form the discharge path of each odd-numbered bit lines BL1, BL3, BL5, BL7, BL9, BL11, BL13 or BL15) in each of the upper mat MAT0 and the lower mat MAT1.

The discharge unit 160 includes a plurality of NMOS transistors N20~N24, which are coupled between the ground voltage input terminal and even-numbered bit lines BL0, BL2, BL4, BL6, BL8, BL10, BL12 and BL14 of the mat MAT2 and are controlled by bit line discharge signals BLDIS_3<0:7>. In this case, the number of NMOS transistors N20~N24 is identical to the number of bit line discharge signals BLDIS_3<0:7>.

In the discharge unit 160, the NMOS transistors N20~N24 are selectively turned on according to the bit line discharge signals BLDIS_3<0:7>, such that a discharge path of each even-numbered bit line BL0, BL2, BL4, BL6, BL8, BL10, BL12 or BL14 is formed.

In this case, the discharge unit 160 forms the discharge path of each even-numbered bit line BL0, BL2, BL4, BL6, BL8, BL10, BL12 or BL14 in the lower mat MAT2.

Operations of the above-mentioned discharge units 120 to 160 according to the embodiment of the present invention will hereinafter be described in detail.

For convenience of description and better understanding of the present invention, it is assumed that the word line WL of the mat MAT1 and the even-numbered bit line BL2 are selected such that a unit cell write or read operation is performed.

First, the column selection signal LYSW_1<1> among the column selection signals LYSW_1<0:7> is activated. In this case, the column selection signals LYSW_1<0:7> are activated in a low level.

Hence, the PMOS transistor P1 controlled by the column selection signal LYSW_1<1> is turned on in the column switching unit 100. The remaining PMOS transistors P0 and P2~P4 coupled to the non-selected even-numbered bit lines BL0, BL4, BL6, . . . , and BL14 are turned off. Therefore, the bit line BL2 is coupled to the global bit line GBL. Here, the selected bit line BL2 is shared by the upper mat MAT0 and the lower mat MAT1.

In this case, the column selection signals LYSW_2<0:7> are deactivated such that all the PMOS transistors P5~P9 of the column switching unit 110 are turned off. That is, the odd-numbered bit lines BL1, BL3, . . . , and BL15 shared by the mats MAT1 and MAT2 are not selected.

In the discharge unit 120, only one NMOS transistor N1 coupled to the selected bit line BL2 is turned off. That is, during an active period, the bit line discharge signal BLDIS_1<1> goes to a low level, such that a discharge path of the selected bit line BL2 is cut off or blocked. On the other hand, during a standby period, the bit line BL2 is in a floating status.

In addition, during the active period, the bit line discharge signals BLDIS_1<0>, and BLDIS_1<2>~BLDIS_1<7> go to a high level. Therefore, the NMOS transistors N0 and N2~N4 coupled to the non-selected even-numbered bit lines BL0, BL4, . . . , and BL14) are turned on. Thus, a discharge path is formed with the ground voltage input terminal through the NMOS transistors N0 and N2~N4, such that it substantially prevents a voltage level of the selected bit line BL2 from being unnecessarily increased during the operation of the mat MAT0.

In this case, the bit line discharge signal BLDIS_1<1> for controlling the selected bit line BL2 is controlled to have a high-level pulse shape before the read or write operation. Therefore, the NMOS transistor N1 is turned on for a short time prior to performing the read or write operation. When the read or write operation begins, the bit line discharge signal BLDIS_1<1> is deactivated to a logic low level.

In this case, during the active period in which the read or write operation is performed, the remaining bit line discharge signals BLDIS_1<0> and BLDIS_1<2>~BLDIS_1<7> are maintained at a high-voltage level. Accordingly, during the active period, the discharge path is formed in each of the non-selected bit lines.

Likewise, in the discharge unit 130, during the active period, the NMOS transistor N16 coupled to the selected bit line BL2 is only turned off, whereas the NMOS transistors N15 and N17~N19 coupled to the remaining non-selected even-numbered bit lines BL0, BL4, . . . , and BL14 are turned on. Thus, the discharge path is formed toward the ground voltage input terminal through the NMOS transistors N15 and N17~N19, such that it substantially prevents the voltage level of the selected bit line BL2 from being unnecessarily increased during the operation of the mat MAT1.

Here, during the operation of the mat MAT0, the discharge unit 140 coupled to the odd-numbered bit lines BL1, BL3, BL5, BL7, BL9, BL11, BL13 and BL15 are activated. That is, in the discharge unit 140 operated by the bit line discharge signals BLDIS_2<0:7>, all the NMOS transistors N5~N9 are turned on, such that the discharge path of each of the non-selected bit lines BL1, BL3, BL5, BL7, BL9, BL11, BL13 and BL15 is formed.

During the operation of the mat MAT1, the discharge unit 150 coupled to the odd-numbered bit lines BL1, BL3, BL5, BL7, BL9, BL11, BL13 and BL15 is activated. In other words, in the discharge unit 150 operated by the bit line discharge signals BLDIS_2<0:7>, all the NMOS transistors N10~N14 are turned on, such that the discharge path of each of the non-selected bit lines BL1, BL3, BL5, BL7, BL9, BL11, BL13 and BL15 is formed.

In this embodiment of the present invention, since it is assumed that the mats MAT0 and MAT1 are operated, the even-numbered bit lines BL0, BL2, BL4, BL6, BL8, BL10, BL12 and BL14 coupled to the mat MAT2 are not selected. Therefore, in the discharge unit 160 coupled to the mat MAT2, the bit line discharge signals BLDIS_3<0:7> are deactivated, such that all the NMOS transistors N20~N24 are turned off.

In the above-mentioned embodiment of the present invention, activation statuses of the bit line discharge signals BLDIS_1<0:7>, BLDIS_2<0:7> and BLDIS_3<0:7> are independently controlled through a coding operation. Therefore, the embodiment of the present invention independently controls individual switching transistors of the discharge units 120~160 in such a manner that the discharge operation is controlled for each desired bit line BL.

Figure 8:
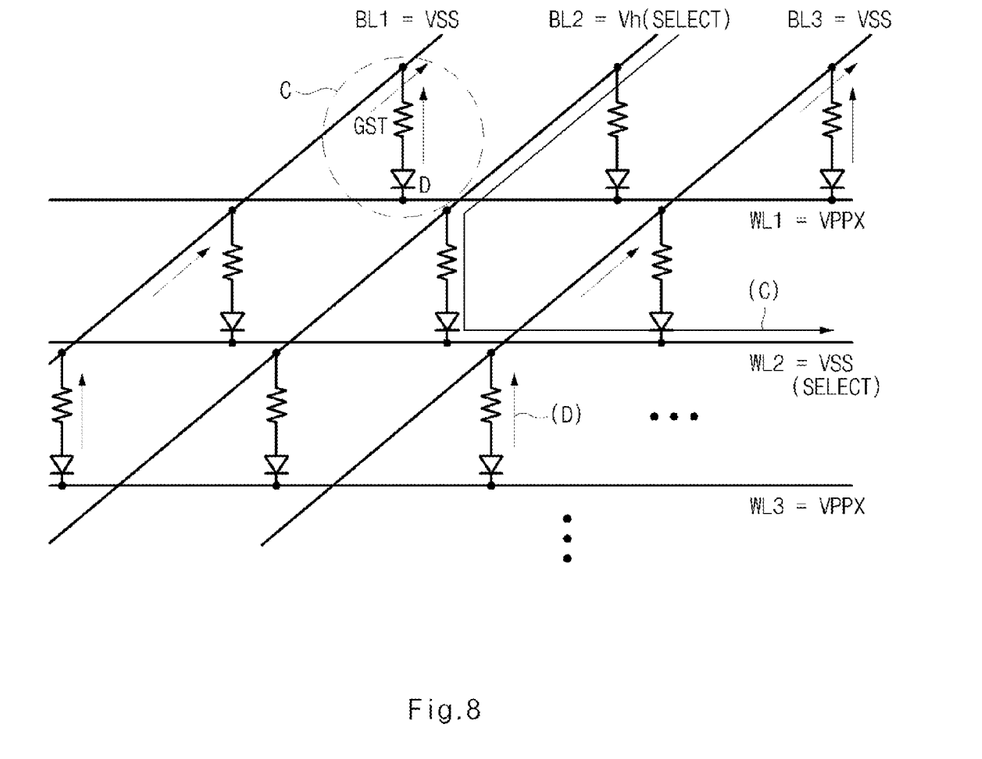
FIG. 8 illustrates a current path in a cell array of a mat shown in FIG. 7 according to an embodiment of the present invention.

FIG. 8 illustrates a current path in a cell array of the mat MAT1 shown in FIG. 7 according to an embodiment of the present invention.

Referring to FIG. 8, the cell array includes a unit cell C disposed in an intersectional area between the bit line BL and the word line WL. The unit cell C includes a phase change resistor (PCR) element GST and a diode D. In this case, the diode D may include a PN diode.

One electrode of the PCR element GST is coupled to the bit line BL, and the other electrode thereof is coupled to a P-type region of the diode D. An N-type region of the diode D is coupled to the word line WL.

In the embodiment of the present invention, a low voltage (e.g., a ground voltage VSS) is applied to a selected word line WL2 during a read operation. In addition, a read voltage Vh is applied to the selected bit line BL2, such that a set-state read current Iset or a reset-state read current Ireset flows in the selected word line WL2 through the bit line BL2, the PCR element GST and the diode D. A current path formed in the read operation is denoted by a path C.

A sense-amplifier senses cell data transmitted through the bit line BL2, and compares the sensed cell data with a reference voltage, such that it discriminates whether the sensed cell data corresponds to data "1" or data "0". When writing data in a unit cell, a write driver provides a driving voltage corresponding to write data to the bit line BL.

In accordance with the embodiment of the present invention, the non-selected bit lines BL1 and BL3 (if necessary, even-numbered bit lines BL0 and BL4 in FIG. 7) may be discharged to a ground voltage level by the discharge unit 150. In addition, the non-selected word lines WL1 and WL3 are maintained at a pumping voltage (VPPX) level.

In the cell array according to the embodiment of the present invention, if the high pumping voltage (VPPX) level is applied to the non-selected word lines WL1 and WL3, an OFF leakage current is generated as shown by a reference character D.

While the non-selected word lines WL1 and WL3 have the high pumping voltage (VPPX) level, the selected word line WL2 has a relatively low ground voltage (VSS) level. In accordance with the embodiment of the present invention, the discharge units 120~160 are adapted to discharge leakage current generated from the non-selected cells, such that they substantially prevents the voltage level of the selected word line WL2 from being unnecessarily increased.

Figure 9:
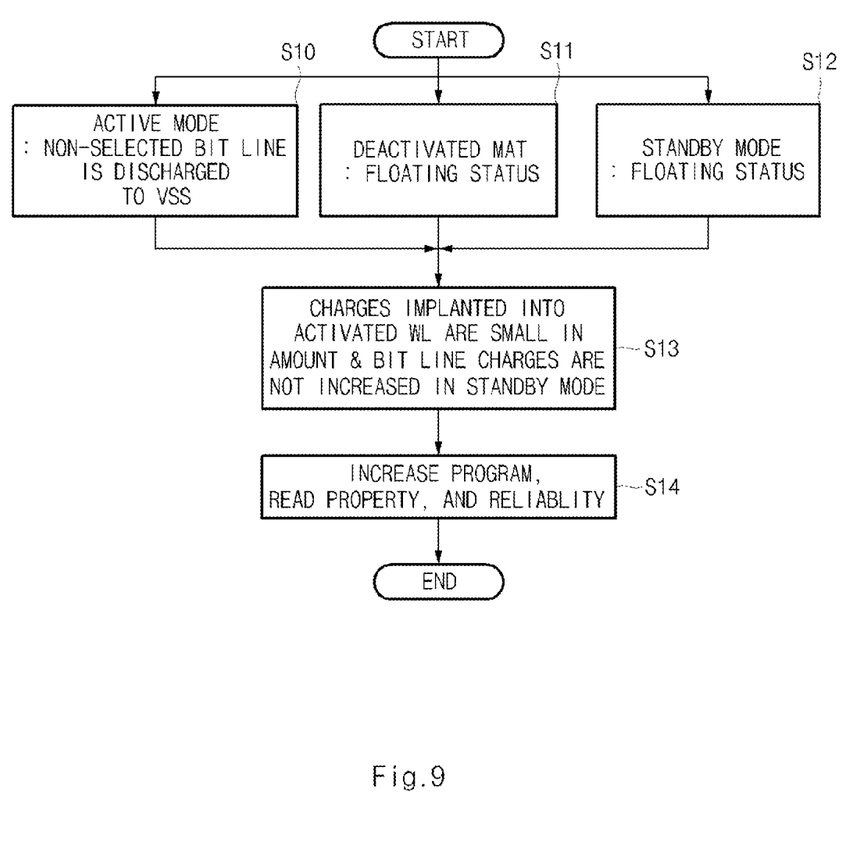
FIG. 9 is a flowchart illustrating operational effects in a leakage path shown in FIG. 8 according to an embodiment of the present invention.

FIG. 9 is a flowchart illustrating operational effects in a leakage path shown in FIG. 8 according to an embodiment of the present invention.

Referring to FIG. 9, during an active mode in which the read or write operation is performed, the non-selected bit lines BL1 and BL3 are discharged with the ground voltage (VSS) level at step S10.

The bit lines BLs coupled to the deactivated mat (e.g., MAT2 in FIG. 7) are in a floating status at step S11.

If a discharge path is formed in all mats, e.g., MAT0~MAT2, a large amount of current flows through the discharge path, and thus a large amount of current flows in the mats in the active or standby mode. Therefore, the bit lines of the selected mats MAT0 and MAT1 are only discharged, and the bit lines of the non-selected mat MAT2 are in the floating status, thereby avoiding excessive current consumption.

In the standby mode after the completion of the active mode, all mats (e.g., mats MAT0~MAT2 in FIG. 7) go to the floating status at step S12.

In accordance with this embodiment of the present invention, the discharge path is formed in the non-selected bit line, such that an amount of electric charges applied into the activated word line WL2 may be reduced. In addition, the voltage level of the selected word line WL2 is not unnecessarily increased, and electric charges of the bit line are not increased during the standby mode at step S13.

In accordance with the embodiment of the present invention, during the active mode, the discharge units 120~160 discharge the non-selected bit lines to substantially prevent a current generated from non-selected unit cells from being applied to the selected word line and thus substantially preventing the voltage levels of the bit line BL and the word line WL from being unnecessarily increased. As a result, the program and read properties and the operation reliability are improved at step S14.

As apparent from the above description, the above-mentioned embodiments of the present invention have the following characteristics.

First, the non-volatile memory device according to the embodiment of the present invention can discharge a non-selected bit line in a read or write operation of data so as to substantially prevent a leakage current from being applied to a word line and a bit line, thereby improving the operation reliability.

Second, the non-volatile memory device according to the embodiment of the present invention discharges a selected bit line for a short time using a pulse-shaped signal prior to performing an active operation, and maintains a turn-on status of a non-selected bit line during the read and/or write operation(s) to thereby form a discharge path of the non-selected bit line.

Third, the non-volatile memory device according to the embodiment of the present invention substantially prevents voltage levels of a bit line and a word line from being increased by a reverse current generated in a diode of a phase change cell, thereby improving the program/read characteristics.

Fourth, the non-volatile memory device according to the embodiment of the present invention codes a bit line discharge signal so as to selectively control a desired bit line to be discharged, resulting in the improvement of discharge characteristics.

Fifth, the non-volatile memory device according to the embodiment of the present invention can improve its own effects in proportion to the number of cells coupled to a bit line. Since one MOS transistor is coupled to one bit line, problems caused by an enlarged cell switch coupled to the bit line can be solved.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
   a cell array comprising a plurality of unit cells configured to be coupled to a plurality of word lines and a plurality of bit lines;
   a column switching unit configured to select one of the plurality of bit lines; and
   a discharge unit configured to discharge bit lines other than the selected bit line among the plurality of bit lines in response to a bit line discharge signal in an active mode in which a read or write operation is performed,
   wherein the plurality of bit lines are shared by a plurality of mats, each mat including a cell array, wherein mats that share the selected bit line among the plurality of mats are activated, and bit lines other than the selected bit line in the activated mats are discharged in the active mode, and wherein mats that do not share the selected bit line among the plurality of mats are deactivated, and a plurality of bit lines corresponding to the deactivated mats is in a floating state in the active mode.

2. The non-volatile memory device according to claim 1, wherein the discharge unit includes a plurality of metal oxide semiconductor (MOS) transistors, each MOS transistor being coupled between each of the plurality of bit lines and a ground voltage terminal, and the MOS transistors being configured to be selectively controlled according to a plurality of bit line discharge signals.

3. The non-volatile memory device according to claim 2, wherein, in the active mode, a first MOS transistor coupled to the selected bit line is turned off in response to a first bit line discharge signal among the plurality of bit line discharge signals.

4. The non-volatile memory device according to claim 3, wherein the first bit line discharge signal is activated before the active mode such that the selected bit line is coupled to the ground voltage terminal.

5. The non-volatile memory device according to claim 4, wherein the first bit line discharge signal is deactivated during the active mode.

6. The non-volatile memory device according to claim 3, wherein bit line discharge signals other than the first bit line discharge signal among the plurality of bit line discharge signals are activated during the active mode.

7. The non-volatile memory device according to claim 2, wherein each bit line discharge signal of the plurality of bit line discharge signals is separately controlled through a coding operation.

8. A non-volatile memory device comprising:
first to third mats, the second and third mats each being adjacent to the first mat, the first mat including a plurality of unit cells configured to be coupled to a plurality of word lines and a plurality of bit lines, wherein a first portion of the plurality of bit lines is shared by the first and second mats, and a second portion of the plurality of bit lines is shared by the first and third mats, each bit line in the first portion and each bit line in the second portion being alternately disposed;
a column switching unit configured to select one bit line of the first portion of the plurality of bit lines;
a first discharge unit disposed near the first mat and configured to discharge bit lines other than the selected bit line among the plurality of bit lines according to a plurality of bit line discharge signals in an active mode in which a read or write operation is performed; and
a second discharge unit disposed near the second mat and configured to discharge the bit lines other than the selected bit line in the first portion according to the plurality of bit line discharge signals in the active mode, wherein the first and second mats are activated in the active mode, and bit lines other than the selected bit line in the first and second mats are discharged in the active mode, and wherein the third mat is deactivated in the active mode, and a plurality of bit lines corresponding to the deactivated third mat is in a floating state in the active mode.

9. The non-volatile memory device according to claim 8, wherein the first discharge unit includes a plurality of first MOS transistors, each of the first MOS transistors being coupled between each bit line of the first portion of the plurality of bit lines and a ground voltage terminal, and the first MOS transistors being selectively controlled according to the plurality of bit line discharge signals.

10. The non-volatile memory device according to claim 9, wherein, in the active mode, one of the first MOS transistors coupled to the selected bit line is turned off in response to a first bit line discharge signal among the plurality of bit line discharge signals.

11. The non-volatile memory device according to claim 10, wherein the first bit line discharge signal is activated before the active mode such that the selected bit line is coupled to the ground voltage terminal.

12. The non-volatile memory device according to claim 11, wherein, in the active mode, the first bit line discharge signal is deactivated, and the bit line discharge signals other than the first bit line discharge signal are activated.

13. The non-volatile memory device according to claim 8, wherein the second discharge unit includes a plurality of second MOS transistors, each of the second MOS transistors being coupled between each bit line of the first portion of the plurality of bit lines and a ground voltage terminal, and the second MOS transistors being selectively controlled according to the plurality of bit line discharge signals.

14. The non-volatile memory device according to claim 13, wherein, in the active mode, one of the second MOS transistors coupled to the selected bit line is turned off in response to a first bit line discharge signal among the plurality of bit line discharge signals.

15. The non-volatile memory device according to claim 14, wherein the first bit line discharge signal is activated before the active mode such that the selected bit line is coupled to the ground voltage terminal.

16. The non-volatile memory device according to claim 15, wherein, in the active mode, the first bit line discharge signal among the plurality of bit line discharge signals is deactivated, and the bit line discharge signals other than the first bit line discharge signal are activated.

17. The non-volatile memory device according to claim 8, wherein each bit line discharge signal of the plurality of bit line discharge signals is separately controlled through a coding operation.

18. The non-volatile memory device according to claim 8, wherein the plurality of bit lines is in a floating state in a standby mode.

* * * * *